United States Patent [19]

Nogami et al.

[11] Patent Number: 5,764,588
[45] Date of Patent: Jun. 9, 1998

[54] MEMORY CIRCUIT

[75] Inventors: Kazutaka Nogami, Ichikawa, Japan; Fumitoshi Hatori, Los Angeles, Calif.

[73] Assignee: Kabushiki Kaisha Toshiba, Kawasaki, Japan

[21] Appl. No.: 848,223

[22] Filed: Apr. 29, 1997

[30] Foreign Application Priority Data

Apr. 30, 1996 [JP] Japan ................................ 8-109898

[51] Int. Cl.$^6$ ........................................ G11C 5/06
[52] U.S. Cl. .................. 365/230.05; 365/149; 365/150; 365/72
[58] Field of Search ............................ 365/230.05, 149, 365/150, 154, 185.03, 185.05, 189.04, 63, 72

[56] References Cited

U.S. PATENT DOCUMENTS

| | | | |
|---|---|---|---|
| 4,322,824 | 3/1982 | Allan | 365/154 |
| 5,276,650 | 1/1994 | Kubota | 365/63 |
| 5,584,874 | 12/1996 | Doluca | 365/154 |
| 5,644,532 | 7/1997 | Chqng | 365/185.05 |

*Primary Examiner*—Tan T. Nguyen
*Attorney, Agent, or Firm*—Oblon, Spivak, McClelland, Maier & Neustadt, P.C.

[57] ABSTRACT

A single-port memory or a multi-port memory with a higher density than conventional memory devices is realized, while using the same design rule, by decreasing the number of bit lines per column or port to decrease the space for wiring and the size of the entire memory. A memory circuit includes a memory cell array arranging a plurality of memory cells in a matrix, each memory cell having at least one read port; word lines each connected to memory cells aligned in a row among the memory cells of the memory cell array, and bit lines each connected to memory cells aligned in n rows ($n \geq 2$) among the memory cells of the memory cell array. Current drivability of access transistors of memory cells sharing n bit lines are set to satisfy the relation of $1:2: \ldots :2^{n-1}$. This results in decreasing the number of bit lines and the area of the memory.

10 Claims, 6 Drawing Sheets

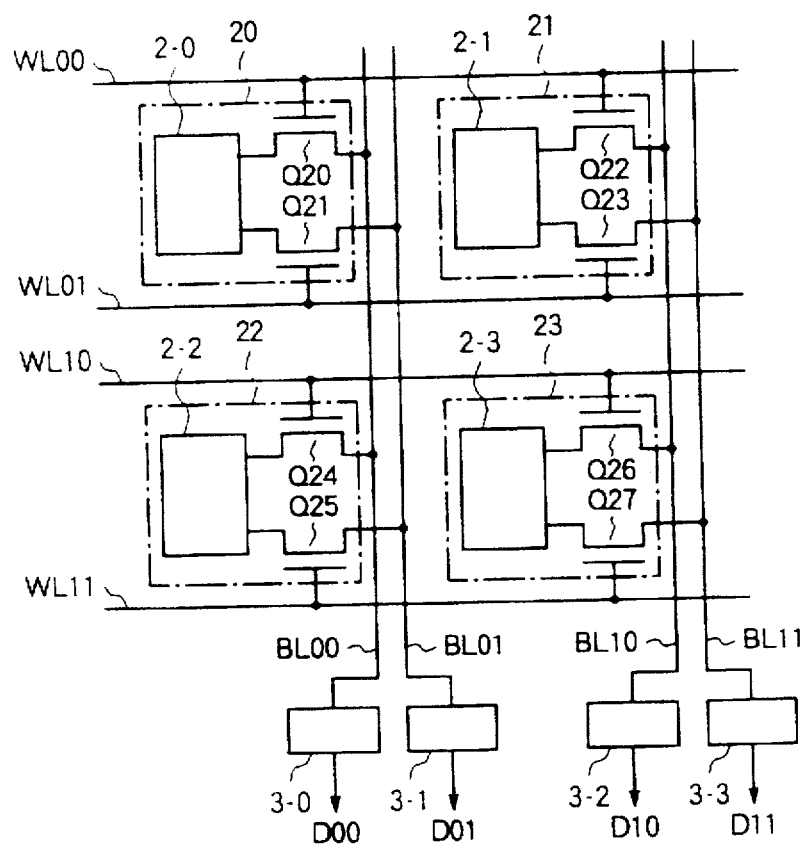
FIG. II PRIOR ART

MEMORY CIRCUIT

BACKGROUND OF THE INVENTION

This invention relates to a memory circuit and, in particular, to a multi-port memory used as large capacity SRAM and ROM, or as a memory integrated in microprocessors, DSPs(Digital Signal Processors), and so on.

FIG. 10 shows a circuit scheme of a conventional single-port memory. This memory arrangement includes word lines WL0, WL1 extending in rows and bit lines BL0, BL1 extending in columns, and memory cells 10, 11, 12 and 13 are arranged in a matrix at crossing points of the word lines and the bit lines.

The memory cells 10, 11, 12, 13 are made of information hold means 2-0, 2-1, 2-2, 2-3 also behaving as current sources, and access transistors Q10, Q11, Q12, Q13 of a transfer gate structure with their sources and drains connected between the information hold means and the bit lines BL0, BL1 and gates connected to the word lines WL0, WL1.

Therefore, memory cells selected by a single word line are connected to different bit lines. In the illustrated example, memory cells 10 and 11 connected to the same word line WLO are connected different bit lines BL0 and BL1.

Reviewing it from the side of the bit lines, memory cells connected to a single bit line are connected to different word lines. Therefore, it does not occur that a plurality of memory cells are selected simultaneously, and only an accessed memory cell can be reliably operated during writing or reading.

FIG. 11 shows a circuit scheme of a conventional two-port memory. This memory includes paired word lines WL00 and W001 for two ports of a respective one of memory cells aligned in a row, paired word lines WL10 and WL11 for two ports of a respective one of memory cells aligned in another row, paired bit lines BL00 and BL01 for two ports of a respective one of memory cells aligned in a column., and paired bit lines BL10 and BL11 for two ports of a respective one of memory cells aligned in another column. Memory cells 20, 21, 22 and 23 are provided at crossing points of the paired word lines and the paired bit lines. Each memory cell is connected to bit lines via selective transistors each turned on by one of paired word lines. In the memory cell 20, for example, the current source 2-0 is connected to the bit line BL00 through a transistor Q20 whose gate is connected to the word line WL00 and to the bit line BL01 through a transistor Q21 whose gate is connected to the word line WL01. Also in the other memory cells, connection is made similarly.

Also in the two-port memory like the single-port memory, memory cells selected by a single word line are connected to different bit lines, and memory cells connected to a single bit line are connected to different word lines. Therefore, it never occurs that ports of a plurality of memory cells are selected simultaneously.

To minimize the scale of a large-capacity memory, the size of each memory cell can be reduced by minimizing the wiring. However, conventional semiconductor memory circuits need at least one bit line for each row of a memory cell array. Although a decrease in number of bit lines is desired for realization of a higher-density memory cell, conventional structures cannot reduce the number of bit lines any more, and this is one of bottlenecks that disturb miniaturization of the entire memory.

Similarly, a multi-port memory needs one bit line for each port and each row. Taking a multi-port memory having a large capacity or a large number of ports into account, conventional structures cannot prevent an increase in size of the entire memory due to the space occupied by the bit lines.

SUMMARY OF THE INVENTION

Taking the above-discussed situation into consideration, an object of the invention is to provide a single-port memory or a multi-port memory with a higher density than conventional memory devices, while using the same design rule, by reducing bit lines heretofore required by one per row or per port and by miniaturizing the size of the entire memory.

According to the invention, there is provided a memory circuit comprising a memory circuit comprising: a memory cell array in a matrix arrangement of a plurality of memory cells each having at least one read port; word lines each connected commonly to memory cells aligned in a row among the memory cells of the memory cell array: and bit line(s each connected commonly to memory cells aligned in n rows (n≧2) among the memory cells of the memory cell array, current drivability, of access transistors of memory cells sharing the n bit lines being set to satisfy the relation of $1:2: \ldots :2^{n-1}$.

The memory circuit may further include current detecting sense amplifiers each connected to each bit line to detect current values flowing in the bit line and too output n-bit data.

According to another aspect of the invention, there is provided a memory circuit comprising: a memory cell array including a matrix arrangement of memory cells each having a plurality of read ports; word lines each connected to memory cells aligned in each row among the memory cells of the memory cell array; and word lines each connected to memory cells aligned in each column among the memory cells of the memory cell array, adjacent memory cells in a single column sharing a single bit line to which at least two read ports are connected, and current drivability of access transistors of n ports (n≧2) sharing the bit line being set to satisfy the relation of $1:2: \ldots :2^{n-1}$.

According to another aspect of the invention, there is provided a memory circuit comprising a plurality of memory cell groups connected to at least one bit line, wherein one memory cell, in maximum, is selected in each memory cell group, and a cell current that can flow in a memory cell in an n-numbered memory cell group is $2^{n-1}$ times a cell current that can flow in a memory cell in a first memory cell group.

Using the above structure, the present invention can make different current values flowing in a bit line by using cell currents in the unit of $2^{n-1}$, and can transmit n-bit information using a single bit line.

As a result, the invention can decrease the number of bit lines heretofore required by one per row or can decrease the number of bit lines per port, and can therefore decrease the entire area of a single-port or multi-port memory.

BRIEF DESCRIPTION OF THE DRAWINGS

FIG. 11 is a circuit diagram of a conventional multi-port memory.

DETAILED DESCRIPTION OF THE PREFERRED EMBODIMENTS

Explained below are some embodiment of the invention with reference to the drawings.

Figure 1:
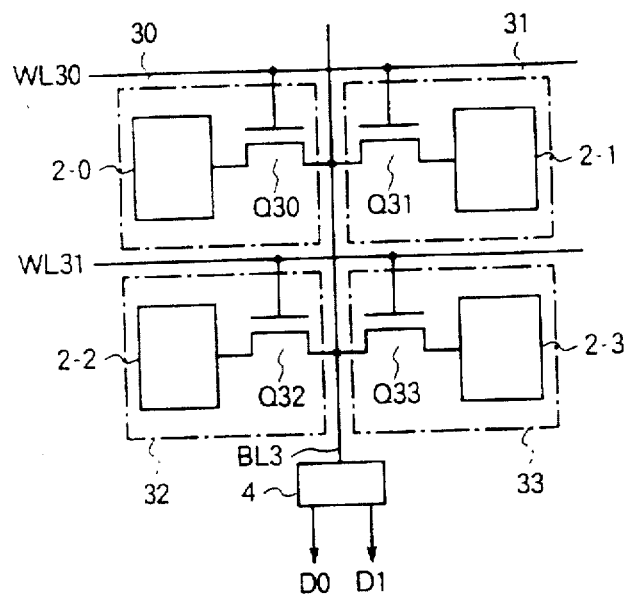
FIG. 1 is a circuit diagram showing a first embodiment of the invention.

FIG. 1 shows an embodiment of the invention applied to a single-port memory. This arrangement includes memory cells 30, 31, 32 and 33 in an arrayed arrangement, word lines WL30, WL31 connected to memory cells aligned in a single row among the memory cells of the memory cell array, bit line BL3 connected to the memory cells, and a sense amplifier 4 connected to the bit line BL3. The memory cells 30, 31, 32 and 33 are made of access transistors Q30, Q31, Q32, Q33, and current supply and information hold means 2-0, 2-1, 2-2, 2-3, respectively.

Figure 10:
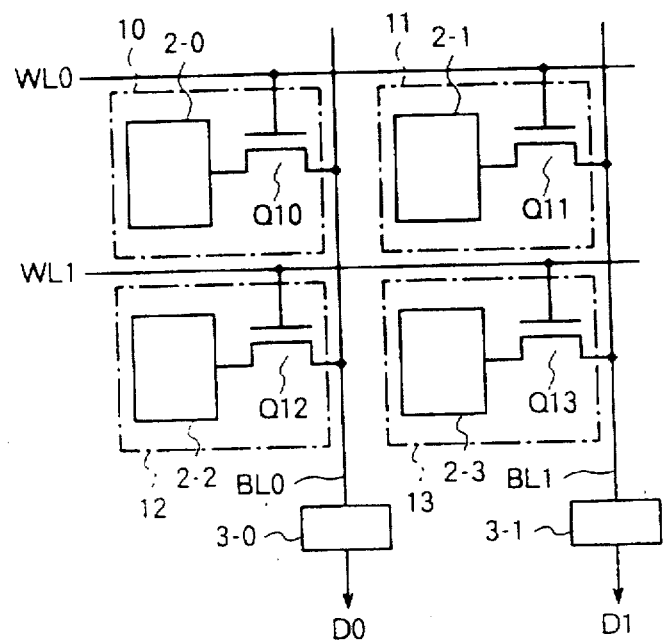
FIG. 10 is a circuit diagram of a conventional single-port memory.

A difference of this arrangement from the conventional arrangement explained with FIG. 10 lies in that a plurality of memory cells selected by a single word line are connected to a common bit line. For example, access transistors Q30 and Q31 of two memory cells 30 and 31 selected when the word line WL30 is selected are connected to the bit line BL3. Similarly, access transistors Q32 and Q33 of two memory cells 32 and 33 selected when the word line WL31 is selected are connected to the same bit line BL3.

Next explained are behaviors of the circuit.

Assuming that the cell current flowing in Q30 is 1 when data of the memory cell 30 is 1 and that the cell current flowing in Q31 is 2 when data of the memory cell 31 is 1, the current flowing in the bit line BL3 varies as shown below, depending on patterns of data held in the memory cells 30, 31.

TABLE 1

| Data in memory cell 30 | Data in memory cell 31 | Cell current |
| --- | --- | --- |
| 0 | 0 | 0 |
| 1 | 0 | 1 |
| 0 | 1 | 2 |
| 1 | 1 | 3 |

Therefore, if the sense amplifier 4 can detect current values in four different values, then two data $D_0$ and $D_1$ stored in memory cells in a common line and two different columns can be output using a single bit line BL3.

This results in reducing the number of bit lines to 0.5 per memory cell, hence reducing the wiring, and decreasing the area of the entire memory smaller than those of conventional memory devices.

Figure 8:
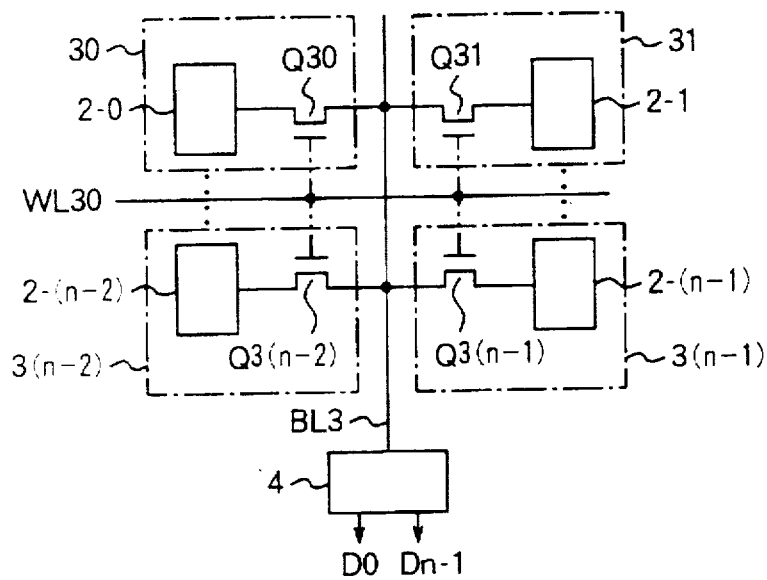
FIG. 8 is a circuit diagram showing a generalized form of FIG. 1.

This concept can be extended such that n memory cells connected to a common word line share a common bit line as shown in FIG. 8. Thus, if the memory is designed to exhibit different cell current values 1, 2, 4, . . . $2^{n-1}$ when data of individual memory cells is "1" and to identify $2^n$ kinds of current values in the sense amplifier, then n-bit data can be transferred from n memory cells 30-3(n-1) through a single bit line BL3. In this case, the number of bit lines can be reduced to 1/n per memory cell, and the area of the memory cell can be reduced more.

Figure 3:
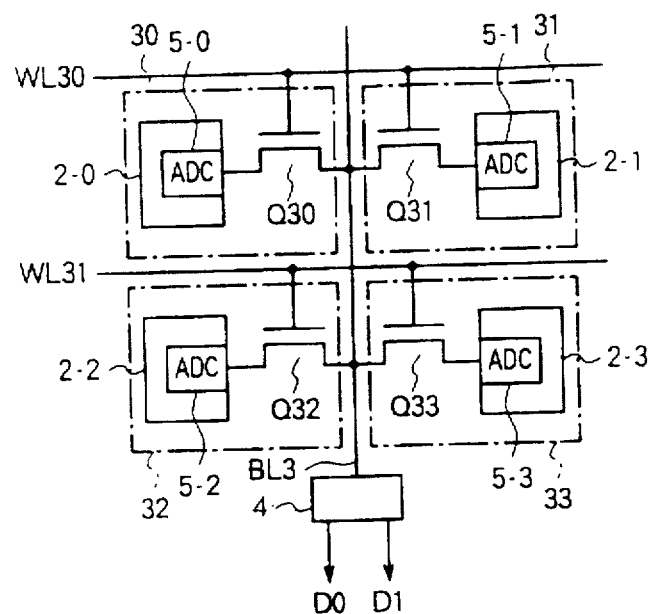
FIG. 3 is a circuit diagram showing an arrangement for selective writing.
Figure 7:
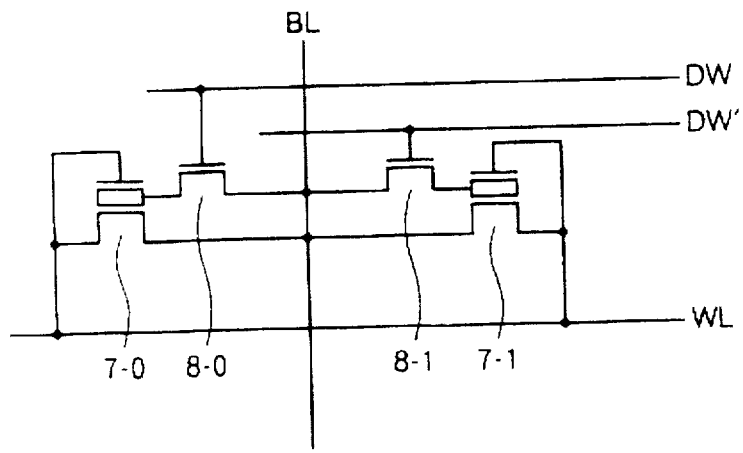
FIG. 7 is a circuit diagram showing an arrangement for selective writing.

The above discussion has been made on reading. For writing, however, precise selection of each memory must be ensured. FIGS. 3 and 7 show examples for this purpose.

In the example of FIG. 3, analog-to-digital (A–D) converters 5-0, 5-1, 5-2, 5-3 are provided in the current supply and information hold means 2-0, 2-1, 2-2, 2-3 to convert (encode) a current value of the bit line into a digital value and to determine whether a memory cell is a write-intended cell or not.

Figure 4:
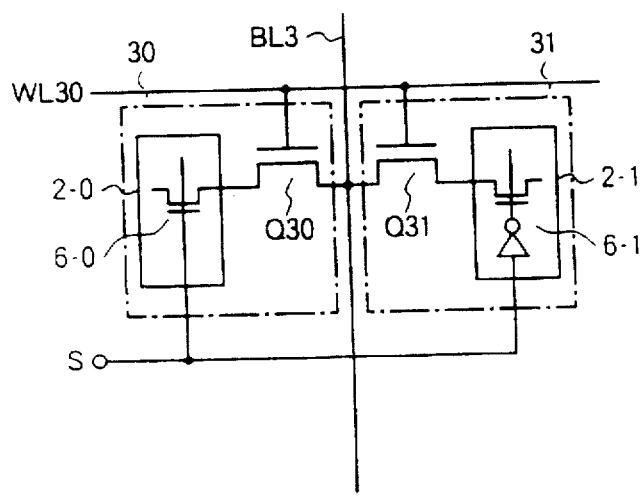
FIG. 4 is a circuit diagram showing an arrangement for selective writing.

FIG. 4 et seq. illustrate memory cells in only one row.

In the example of FIG. 4, time-divisional switches 6-0 and 6-1 in form of transfer gates selectively turned on by a control signal S are provided in the current supply and information hold means 2-0 and 2-1, and data can be written in one of these two memory cells selected by the control signal among those selected by a word line and a bit line during writing.

Figure 5:
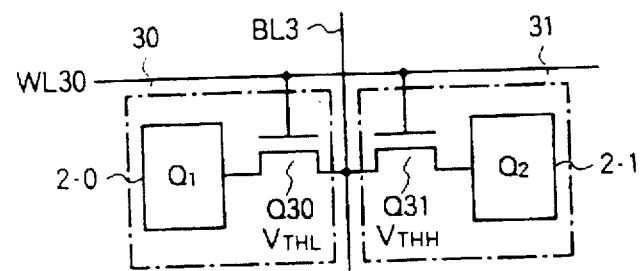
FIG. 5 is a circuit diagram showing an arrangement for selective writing.

FIG. 5 shows an example in which threshold values of access transistors Q30 and Q31 are set to $V_{THL}$ and $V_{THH}$ (where $V_{THL} < V_{THH}$), respectively. In this arrangement, when the word line potential is $V_{WL}$, data of "0" can be stored in both cells when $V_{WL} < V_{THL}$, Q1="1" and Q2="0" when $V_{THL} < V_{WL} < V_{THH}$, and data of "1" in both cells when $V_{THH} < H_{WL}$. However, Q1 and Q2 cannot be set to Q1="0" and Q2="1".

Figure 6:
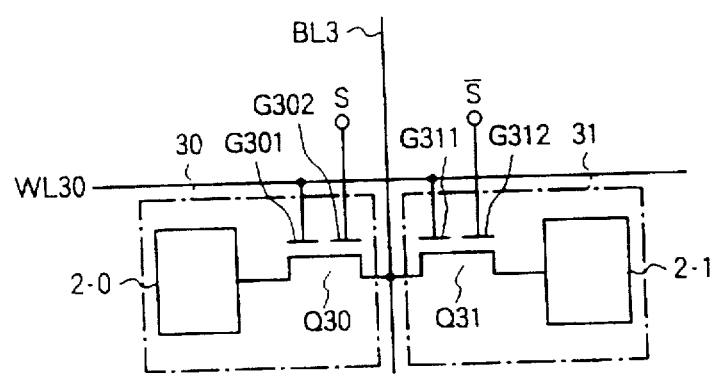
FIG. 6 is a circuit diagram showing an arrangement for selective writing.

FIG. 6 shows an example where control gates G302 and G312 are provided in addition to usual gates G301 and G311 in access transistors Q30 and Q31. The control gates G302 and 234 G312 are connected to opposite logic control signals S and /S, respectively, and permit selection in the same manner as the example of FIG. 4.

The example of FIG. 7 uses MNOS transistors 7-0 and 7-1 each having a silicon nitride film between a polysilicon gate and a gate oxide film having a source and a drain connected between a word line and a bit line to select a memory cell, and transistors 8-0 and 8-1 each having a source and a drain connected between the silicon nitride film and the bit line with their gates connected to control lines DW and DW'. Essential behaviors of the circuit is the same as that of FIG. 4.

There are other possible ways of selection, such as one using CCD or cascade-connected cells, and one configured to write data in a descending or ascending order.

Figure 2:
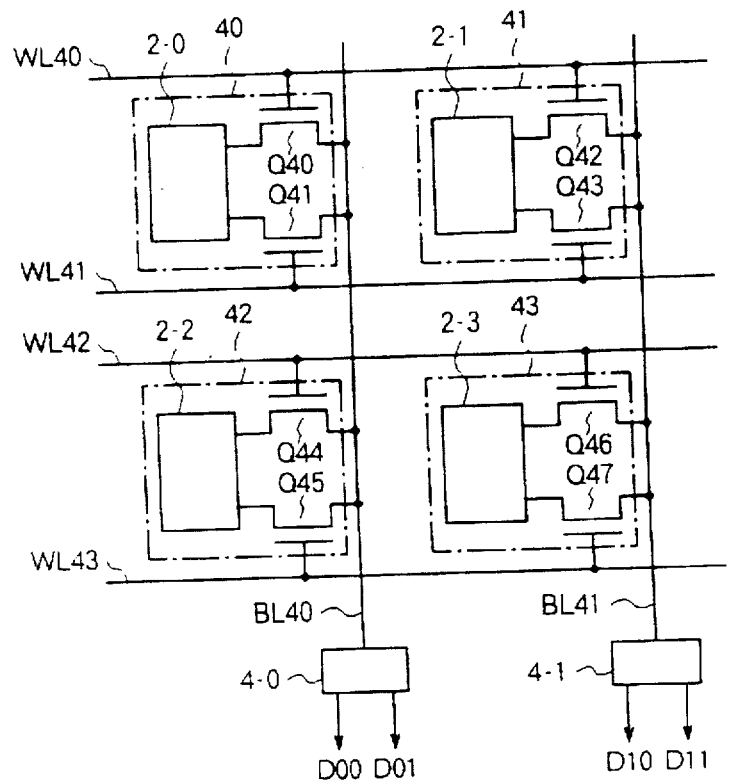
FIG. 2 is a circuit diagram showing a second embodiment of the invention.

FIG. 2 shows a second embodiment of the invention applied to a two-port memory. This arrangement includes memory cells 40, 41, 42 and 43 in an arrayed arrangement, first-port word lines WL40, WL42, second-port word lines WL41, WL43, bit lines BL40, BL41 each connected to ports of cells in a common column, and sense amplifiers 4-0, 4-1 connected to respective bit lines.

Memory cells 40, 41, 42, 43 are made of access transistors Q40, Q41, Q42, Q43, Q44, Q45, Q46, Q47, and current supply and information hold means 2-0, 2-1, 2-2, 2-3.

In this embodiment, two ports of each memory cell are connected to a common bit line. For example, both the access transistor Q40 at the first port of the memory cell 40 and the access transistor Q41 of the second port are connected to a common bit line BL40.

Explained below are behaviors of the circuit.

Here is taken an example where two ports access to memory cells in different columns. In case that the first port selects the word line WL40 and the second port selects the word line WL43, two access transistors Q40 and Q45 connected to the bit line BL40 are turned on. Assuming that the cell current flowing in Q40 is 1 when data of the memory cell 40 is 1 and that the cell current flowing in Q45 is 2 when data of the memory cell 42 is 1, four different cell currents flow in the bit line BL40 depending on the data pasterns. If the sense amplifier 4 can identify respective current values, then the circuit can output two-bit data $D_{00}$ and $D_{01}$ corresponding to the first port of the memory cell 40 and the second port of the memory cell 42.

In this manner, the number of bit lines can be decreased to 0.5 per memory cell, and the area of the memory cells can be made smaller than those of conventional memory devices.

In the arrangement of FIG. 2, when the cell current flowing in a transistor connected to a first port is 1, and the cell current flowing in another transistor connected to a second port is 2, the size of the transistor connected to the second port becomes larger than the size of the transistor connected to the first port. As a result, the capacitance of the word line of the first port becomes larger than the capacitance of the word line of the first port, and the second port takes a longer access time than that of the first port. This problem, however, can be solved by changing the sizes of access transistors connected to a common port in every adjacent columns.

For example, the cell current flowing in the access transistors Q40, Q43, Q44, Q47 is set to 1, and the cell current flowing in the access-transistor Q41, Q42, Q45, Q46 to 2, using as a second port a data port that outputs 1 when the current flowing in the bit line BL40 is 2 or more, and using as a first port a data port that outputs 1 when the current flowing in the bit line BL41 is 2 or more. In this manner, capacities of all word lines can be made equal, and access times of all ports can be made equal. If the data width is an odd number, the capacitances of word lines cannot be made equal. However, a design using a difference in gate capacitance between the transistor with the cell current of 1 and the transistor with the cell current of 2.

Figure 9:
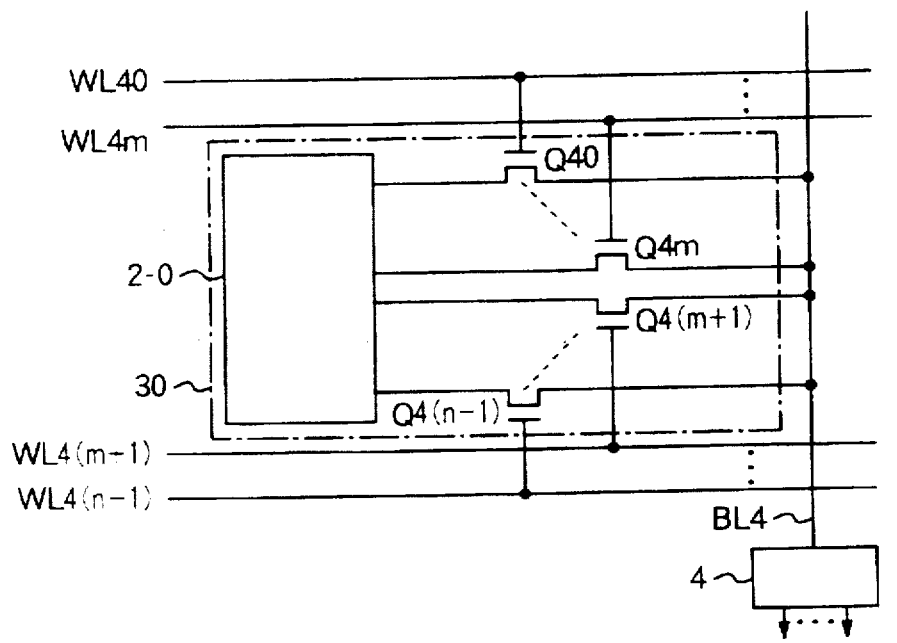
FIG. 9 is a circuit diagram showing a generalized form of FIG. 2.

In case of an n-port memory as shown in FIG. 9, by using cell current values 1, 2, 4, . . . $2^{n-1}$ flowing in n access transistors Q40-Q4(n-1) when data of respective memory cells is "1", and if the sense amplifier can detect $2^n$ kinds of different current values, n-bit data corresponding to n-ports can be transferred using a single bit line BL4. Thus, the number of bit lines can be reduced to 1/n per each port of a memory cell, a further decrease in area of the memory cells is promised.

As described above, the present invention can make different current values flowing in a bit line by using cell currents in the unit of $2^{n-1}$, and can transmit n-bit information using a single bit line.

As a result, the invention can decrease the number of bit lines per each bit line or port in each column, and can decrease the entire area of a single-port or multi-port memory.

What is claimed is:

1. A memory circuit comprising:

a memory cell array in a matrix arrangement of a plurality of memory cells each having at least one read port;

word lines each connected commonly to memory cells aligned in a row among the memory cells of the memory cell array: and bit lines each connected commonly to memory cells aligned in n rows (n≧2) among the memory cells of the memory cell array, current drivability of access transistors of memory cells sharing said n bit lines being set to satisfy the relation of 1:2: . . . :$2_{n-1}$.

2. The memory circuit according to claim 1 further comprising current detecting sense amplifiers each connected to each said bit line to detect current values flowing in said bit line and to output n-bit date.

3. The memory circuit according to claim 1 wherein current drivability of said access transistors of 2 memory cells connected to at least one word line are different from each other.

4. The memory circuit according to claim 1 wherein threshold values of said access transistors of 2 memory cells connected to at least one of said word lines are different from each other.

5. The memory circuit according to claim 1 wherein said memory cells contain converter means for A/D-converting a current value of said bit line.

6. The memory circuit according to claim 1 wherein said memory cells contain switch means responsive to a control signal to selectively connect information hold means to said bit line.

7. A memory circuit comprising:

a memory cell array including a matrix arrangement of memory cells each having a plurality of read ports;

word lines each connected to memory cells aligned in each row among said memory cells of said memory cell array; and bit lines each connected to memory cells aligned in each column among said memory cells of said memory cell array, adjacent memory cells in a single column sharing a single bit line to which at least two of said read ports are connected, and current drivability of access transistors of n ports (n≧2) sharing said bit line being set to satisfy the relation of 1:2: . . . :$2^{n-1}$.

8. The memory circuit according to claim 7 further comprising current detecting sense amplifiers each connected to each said bit line to detect values of currents flowing in said bit line and to output n-bit data.

9. A memory circuit comprising:

a memory cell array in a matrix arrangement of memory cells having m (m≧2) columns and n (n≧2) rows;

word lines to each of which m memory cells arranged in a row among said n rows being connected; and at least one bit line to which at most one memory cell arranged in said n rows being connected;

a current detecting sense amplifier which identifies $2^m$ kinds of current values;

wherein a cell current value that flows in a memory cell in an m-numbered memory cell column is $2^{m-1}$ times a cell current value that flows in a memory cell in a first memory cell column.

10. The memory circuit according to claim 9, wherein said current detecting sense amplifier connected to said bit line detects values of currents flowing in said bit line and outputs n-bit data.

* * * * *